United States Patent [19]
Aboaf et al.

[11] 3,961,353
[45] June 1, 1976

[54] HIGH POWER SEMICONDUCTOR DEVICE

[75] Inventors: Joseph A. Aboaf, Peekskill; Robert W. Broadie, Hopewell Junction; Edward M. Hull, LaGrangeville; H. Bernhard Pogge, Hopewell Junction, all of N.Y.

[73] Assignee: International Business Machines Corporation, Armonk, N.Y.

[22] Filed: Oct. 21, 1974

[21] Appl. No.: 516,064

[52] U.S. Cl. .................................... 357/34; 357/88; 357/89
[51] Int. Cl.² ......................................... H01L 29/72
[58] Field of Search ................... 357/50, 59, 34, 88, 357/89

[56] References Cited
UNITED STATES PATENTS

| | | | |
|---|---|---|---|
| 3,617,822 | 11/1971 | Kobayashi | 357/50 |
| 3,640,806 | 2/1972 | Watanabe | 357/50 |
| 3,649,383 | 3/1972 | Akasaki | 357/59 |
| 3,694,276 | 9/1972 | Wakamiya et al. | 357/59 |
| 3,703,420 | 11/1972 | Vora | 357/59 |
| 3,775,196 | 11/1973 | Wakamiya et al. | 357/59 |

FOREIGN PATENTS OR APPLICATIONS

| | | | |
|---|---|---|---|
| 923,513 | 4/1963 | United Kingdom | 357/48 |

*Primary Examiner*—Andrew J. James
*Attorney, Agent, or Firm*—Joseph L. Spiegel

[57] ABSTRACT

A high power semiconductor device is formed by providing a semiconductor substrate of N⁻ conductivity, rendering the backside of same porous as by subjecting same to anodic treatment carried out in a concentrated solution of hydrofluoric acid, converting the porous region to an N⁺ region, as by arsenic diffusion and forming an active device by conventional techniques in the top surface of the substrate. The method permits usage of high quality N⁻ substrates and at the same time eliminates the requirement of growing thick epitaxial layers.

6 Claims, 10 Drawing Figures

HIGH POWER SEMICONDUCTOR DEVICE

BACKGROUND OF THE INVENTION

The present invention relates to the semiconductor devices and to methods of producing same. While not so limited, the invention finds immediate application in the production of high power semiconductor devices.

DESCRIPTION OF THE PRIOR ART

For the purposes of the ensuing discussion, a high power semiconductor device is considered to be a high voltage (on the order of up to 1,000 volts and higher), high current (on the order of 8–13 amperes) device formed alone or with other devices within a large (typically a 230 mil square) slice or chip of semiconductor material.

In accordance with conventional prior art techniques for producing high power semiconductor devices, a semiconductor wafer or substrate is provided with a layer formed thereon. For example, the substrate may be a 16 mil thick silicon substrate of $N^+$ conductivity. Typical dopants employed are preferably arsenic, or alternatively, phosphorus or antimony and impurity concentration of the order of at least $10^{20}$ atoms/cm$^3$.

An epitaxial layer is formed on this substrate by chemical vapor deposition techniques. Typically an epitaxial layer of $N^-$ conductivity is grown with a resistivity on the order of 10–50 ohm-centimeters and carrier concentration of the order of $10^{14}$ atoms/cm$^3$.

This epitaxial layer is quite thick, of the order of 3–4 mils, and it is the thickness of this epitaxial layer which has given rise to process problems in the past. This is partly due to the fact that the epitaxy grows not only on the wafers but also on the wafer supporting susceptor itself, making removal of wafers from susceptor difficult. Moreover due to the thermal mismatch between the wafers and the susceptor, slip lines and stresses develop in the wafers when the wafers are cooled from the growth temperature. A further problem is the enhanced growth of epitaxy at the edge of the wafer which creates a rim at the periphery and necessitates further processing to remove same.

Quite apart from the difficulty in growing good quality thick epitaxial layers is the problem of obtaining high quality $N^+$ wafers whose crystallographic structure is not always good due to the heavy doping.

SUMMARY OF THE INVENTION

Accordingly, an object of the invention is an improved high power semiconductor device processing method.

Another object is to form such devices on good, quality substrates.

Still another object is forming such devices wherein the requirement for the growth of thick epitaxial layers is eliminated.

These and other objects are accomplished in accordance with the present invention, one illustrative embodiment of which comprises providing a semiconductor substrate of $N^-$ conductivity, rendering the backside of same porous as by subjecting same to anodic treatment carried out in a concentrated solution of hydrofluoric acid, converting the porous region to an $N^+$ region to act as a collector, as by arsenic diffusion and completing an active device by forming the other components of the device using conventional techniques in the top surface of the substrate. The method permits usage of high quality $N^-$ substrates and at the same time eliminates the requirement of growing thick epitaxial layers.

BRIEF DESCRIPTION OF THE DRAWING

The foregoing, and other objects, features and advantages of the invention will be apparent from the following, more particular description of the preferred embodiments, as illustrated in the accompanying drawing, wherein:

FIGS. 1A–1K are front elevational views in cross section of a portion of a semiconductor substrate during successive states of manufacture of a semiconductor device.

DESCRIPTION OF THE PREFERRED EMBODIMENTS

Figure 1A:
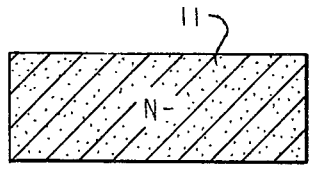
Figure 1F:
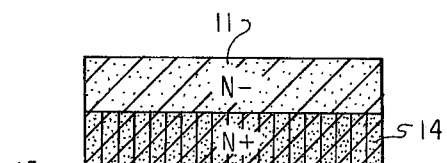

Referring now to the drawings there is disclosed a preferred method for fabricating devices in accordance with the teachings of the present invention. In step 1A a wafer or substrate 11 of $N^-$-type silicon semiconductor material, typically 1¼ inches in diameter and 8 mils thick, having a <100> crystallographic orientation and a resistivity of 10–30 ohm-centimeters is provided. The substrate is provided with flat, smooth opposing top and back surfaces.

Figure 1B:
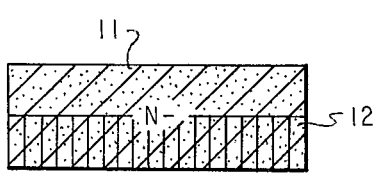
Figure 1G:
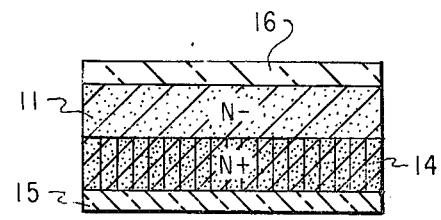

In the next operation, FIG. 1B, a porous layer 12 is provided on the backside of the substrate. A preferred method for rendering the backside surface porous is to subject same to an anodic treatment carried out in a concentrated solution of hydrofluoric acid. Typically the wafer is first inserted within a suitable holding device and then immersed within the solution. During immersion the substrate acts as an anode and a conductive member which is likewise inserted within the solution but is not readily dissoluble therein acts as a cathode. When a DC voltage is applied therebetween a reaction takes place causing gradual deep pore formation on the side of the substrate exposed to the electrolytic solution.

The amount of porosity and depth of same is proportional to the concentration of the hydrofluoric solution, current density and time. In a typical operation the wafers are immersed in a 25% hydrofluoric solution and subjected to current densities on the order of 10 ma/cm$^2$ for 35 minutes yielding a porous layer 100 microns thick and of 15% porosity as measured by weight loss in the porous layer.

Figure 1C:
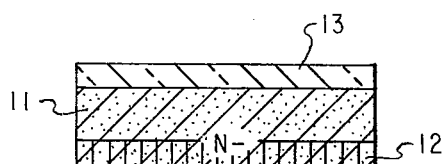

In the next operation, FIG. 1C, a pyrolytically deposited silicon dioxide layer 13 is formed on the top side of the wafer 11, using conventional techniques, to protect same during subsequent operations.

Figure 1H:
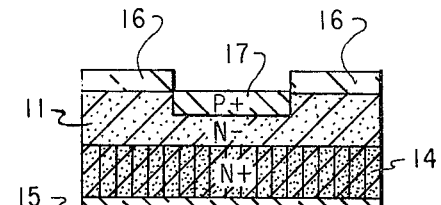
Figure 1D:
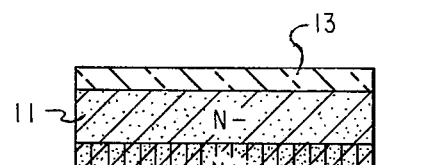

Following this, in FIG. 1D, the porous layer 12 is converted from an $N^-$ to an $N^+$ region 14. In a typical operation the porous region is subjected to an arsenic capsule diffusion at 1000°C. for 2 hours. This diffusion is sufficient to dope completely 100 microns of porous silicon. Although arsenic is preferred other dopants could be used and other doping techniques could be employed such as ion implant doped oxide.

Thus far a specific method for producing a high power semiconductor device using an $N^-$ substrate has been described. It will be appreciated, however, that the teachings of the present invention may be put to use when making other type devices.

In such other cases the specific type semiconductor material and conductivity type may be different. For example, one might have a $P^-$ wafer, render a portion of same porous and convert said porous layer to either P+ or N+ conductivity.

Figure 1J:
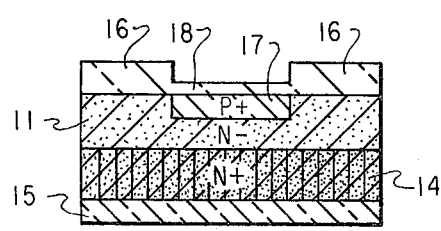
Figure 1E:
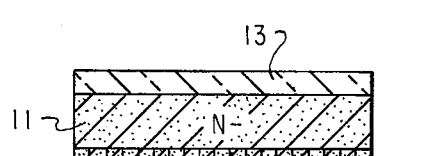
Figure 1K:
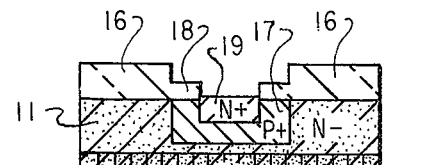

In the next operation, FIG. 1E, a polycrystalline silicon layer 15 is deposited over the porous N+ region to protect same against oxidation in subsequent processing steps. The thickness of this polysilicon layer will depend upon the percentage of porosity resulting from step 1B. Thus, if the porosity is higher the thickness of the polysilicon must be increased in order to obtain an oxygen-tight film. For the illustrative example described herein an $Si^H4$ deposition process carried out at 650°C. is used to form the polycrystalline silicon dioxide layer with a thickness of $4.1\mu$.

In step 1F, the pyrolytic silicon dioxide layer 13 is stripped from the top surface of the wafer by standard silicon dioxide etching techniques.

Then follow conventional steps for forming an active device within the wafer 11. In step 1Ga passivating layer 16 of silicon dioxide or other suitable material is formed as by thermal growth techniques on the top surface of the wafer.

In a typical operation the oxide is grown at 1,050°C. in a wet-dry-wet atmosphere for 5–22–5 minutes respectively, to form an oxide layer 9200 Angstroms thick.

In the next operation FIG. 1H, holes or windows are formed in the oxide layer by conventional photolithographic masking and etching techniques. A buffered solution of hydrogen fluoride serves as a suitable etchant in this step.

Following this a conventional diffusion and drive in operation preferably using boron is conducted for the purpose of forming a P+ base region 17 in a to-be-formed transistor.

In a typical capsule diffusion operation the substrate is doped using boron of an impurity concentration of about $2.9 \times 10^{20}$ ohms per cubic cm. at 1125°C. for 100 minutes. This boron diffusion produced a surface resistivity of 8.2 ohms per square and a junction depth of 3.37 microns. The drive-in operation follows at 125°C. in an $O_2$–$H_2O$–$O_2$ atmosphere for 5–150–5 minutes, respectively. A thermal oxide layer some 8000 Angstroms thick is formed. This is followed by 39 hours in a nitrogen atmosphere to form the P+ base region 17, approximately 8600 A thick. The drive-in operation changes the surface resistivity to 15.7 ohms per square and deepens the junction depth to 14 microns.

In FIG. 1J, the oxide layer is shown regrown as at 18 to protect the underlying regions.

Following this, in step 1K, holes are formed in the oxide layer and a conventional diffusion and drive-in operation is conducted for the purpose of forming an N+ emitter region 19 of a transistor. Arsenic capsule diffusion is preferred.

In subsequent operations (not shown), contacts are made to the emitter, base and collector regions. Typically, contacts to the emitter and base regions are made from the upper surface and to the collector region from the lower surface.

The completed transistor structure typically is characterized by the following parameter values: N+ emitter region depth 10 microns; P+ base width 10 microns; N− collector region 80 microns; N+ porous region 100 microns thickness.

This completes one method of forming a high power semiconductor device within an N− wafer or substrate. The N− substrate quality is typically much better than N+ substrates and the requirement for the growth of a thick epitaxial layer is eliminated.

The foregoing description is but one method for forming a high power semiconductor device within an N− wafer or substrate. Numerous changes can be made without parting from the spirit and scope of the invention.

For example, one can initially form the transistor structure within the top surface of the substrate and, following that, render the backside porous and convert same to a region of higher conductivity. In still another alternate embodiment of this invention the emitter and porous collector region diffusion operations can be carried out simultaneously.

Thus, while the invention has been particularly shown and described with reference to the preferred embodiment thereof, it will be understood by those skilled in the art that various changes in form and detail may be made without departing from the spirit and scope of the invention.

What is claimed is:
1. A semiconductor device comprising:
   a semiconductor substrate; and,
   a porous portion within said substrate doped to form a region of higher conductivity than said substrate.
2. The invention defined by claim 2 wherein:
   said substrate has a top and back surface;
   said higher conductivity region extends inwardly of said back surface; and,
   at least one region of opposite conductivity than said high conductivity region extending from said substrate top surface for forming a semiconductor device.
3. The invention defined by claim 1 wherein said substrate is of N− conductivity and said region of high conductivity is N+.
4. The invention defined by claim 1 wherein said porous portion includes void areas on the order of 15% as measured by weight loss in said porous portion.
5. The invention defined by claim 4 wherein:
   said substrate has a top and back surface;
   said higher conductivity region extends inwardly of said back surface; and,
   at least one region of opposite conductivity than said high conductivity region extending from said substrate top surface for forming a semiconductor device.
6. The invention defined by claim 4 wherein said substrate is of N− conductivity and said region of high conductivity is N+.

* * * * *